(12) United States Patent
Lin

(10) Patent No.: US 6,771,079 B2
(45) Date of Patent: Aug. 3, 2004

(54) AUTOMOBILE MULTI-PURPOSE DC SOURCE PROTECTION MONITOR

(75) Inventor: Jack Lin, Taipei (TW)

(73) Assignee: Poweramper Electronic Industry Corp., Taichung Hsien (TW)

( * ) Notice: Subject to any disclaimer, the term of this patent is extended or adjusted under 35 U.S.C. 154(b) by 0 days.

(21) Appl. No.: 10/226,335

(22) Filed: Aug. 23, 2002

(65) Prior Publication Data

US 2004/0036480 A1 Feb. 26, 2004

(51) Int. Cl.$^7$ .................... G01R 31/02; H01H 85/30
(52) U.S. Cl. ................. 324/550; 324/503; 324/507; 324/511; 361/103; 361/104; 307/10.1
(58) Field of Search ................. 324/550, 503, 324/507, 511; 361/103, 104, 58; 307/10.1; 340/638, 870.16

(56) References Cited

U.S. PATENT DOCUMENTS 4,554,607 A * 11/1985 Mora .................. 361/104
6,476,729 B1 * 11/2002 Liu .................. 340/870.11

\* cited by examiner

*Primary Examiner*—N. Le
*Assistant Examiner*—Vincent Q. Nguyen
(74) *Attorney, Agent, or Firm*—Leong C. Lei

(57) ABSTRACT

An automobile multi-purpose DC source protection monitor includes of a fuse protection module; multiple units of fuse being arranged on each fuse-carrier, then respectively connected to electric appliance; individual sensor being provided to form individual detection loop; a signal retrieval module connected to each sensor through transmission wire to convert analog signals detected by each fuse into digital signals; and a display module to clearly indicate the location of a failing fuse, immediate display of voltage, amperage and power in numeric values by means of the signal retrieval module and the digital signals of the detection loop from each fuse on the fuse-carrier.

2 Claims, 4 Drawing Sheets

AUTOMOBILE MULTI-PURPOSE DC SOURCE PROTECTION MONITOR

BACKGROUND OF THE INVENTION (a) Field of the Invention

The present invention is related to an automobile multi-purpose DC source protection monitor, and more particularly, to one that clearly indicates the location of failed fuse, immediate voltage, amperage and power numeric values.

(b) Description of the Prior Art

To avoid damage by surge to internal circuit due to short or overload, a protection loop is usually provided for an electric appliance. Fuse is the option on considering of cost. Once the amperage gets greater than the preset value, the fuse is automatically burnt out to separate the electric appliance from the source; however, identification of the location of the burnt fuse for replacement with a new one relies upon manual inspection of all fuses one by one, meaning consumption of lots of time and efforts. It is particularly true in case of the service of an automobile since the source for electric appliances is usually located in the complicate structure of engine.

SUMMARY OF THE INVENTION

The primary purpose of the present invention is to provide an automobile multi-purpose DC source protection monitor to display the location of the failing fuse, and the numeric values of amperage, voltage and power. To achieve the purpose, multiple units of fuse are arranged on each fuse carrier, then respectively connected to a signal retrieval module by means of transmission wire to convert analog signals detected into digital signals, and further into numeric values to be outputted from a display module mounted on the instrument panel to display.

Another purpose of the present invention is to provide an automobile multi-purpose DC source protection monitor, wherein, the instrument panel where the display module is mounted is further provided with a peak hold indicator to display the maximal value retrieved once the amperage exceeds the preset maximal amperage and power values; and adapted with a source status LED to display whether the display module on the instrument panel is in ON status.

The foregoing object and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENT

The following descriptions are of exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
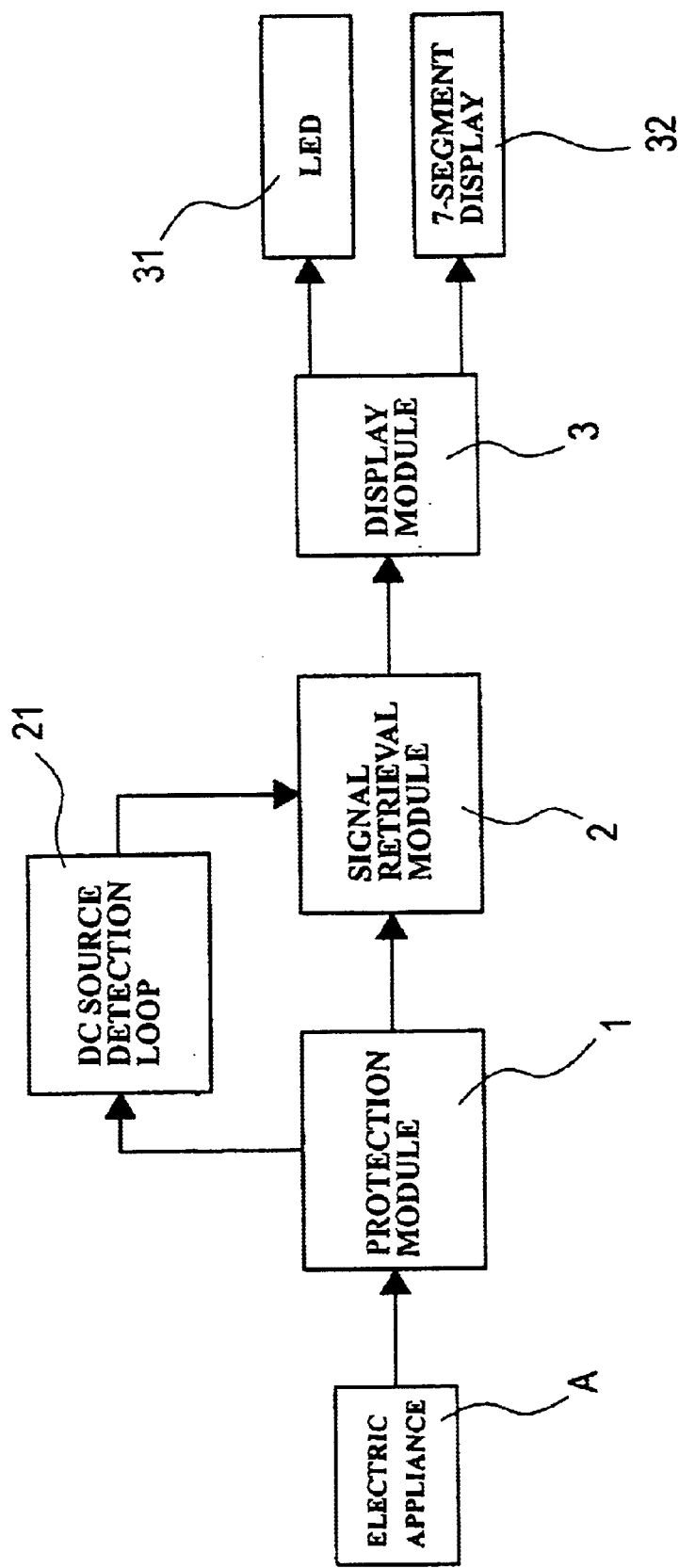
FIG. 1 is a block chart of the present invention.
Figure 2:
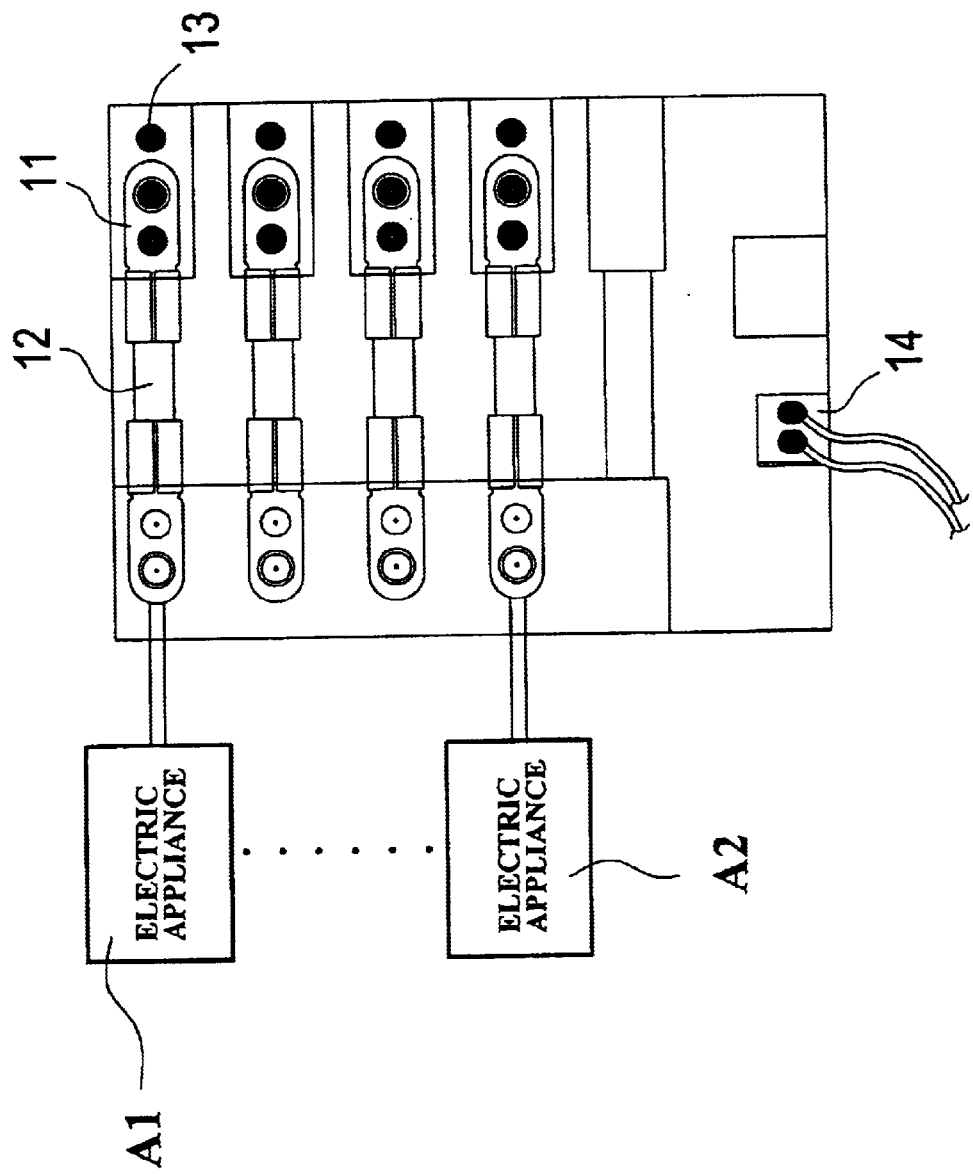
FIG. 2 is a schematic view showing that the present invention is connected to an instrument panel.

Referring to FIG. 1, the present invention related to an automobile multi-purpose DC source protection monitor is essentially comprised of a fuse protection module 1, a signal retrieval module 2 and a display module 3. Wherein, the fuse protection module 1, also as illustrated in FIG. 2, comprised of multiple units of fuse arranged on each fuse carrier 11 with each unit respectively connected to an electric appliance A to individually protect the electric appliance A from burning out due to abnormality including short or overload; each fuse 12 is separately connected to a transmission base 14 through a sensor 13 to form an individual detection loop connected to the signal retrieval module 2 through the transmission base 14.

The signal retrieval module 2 including a DC source detection loop 21 formed by the sensor 13 and each fuse 12 converts analog signals of amperage and voltage detected into digital signals to drive the display module 3 to operate by connecting the display module 3 by means of a control wire 22.

Figure 3:
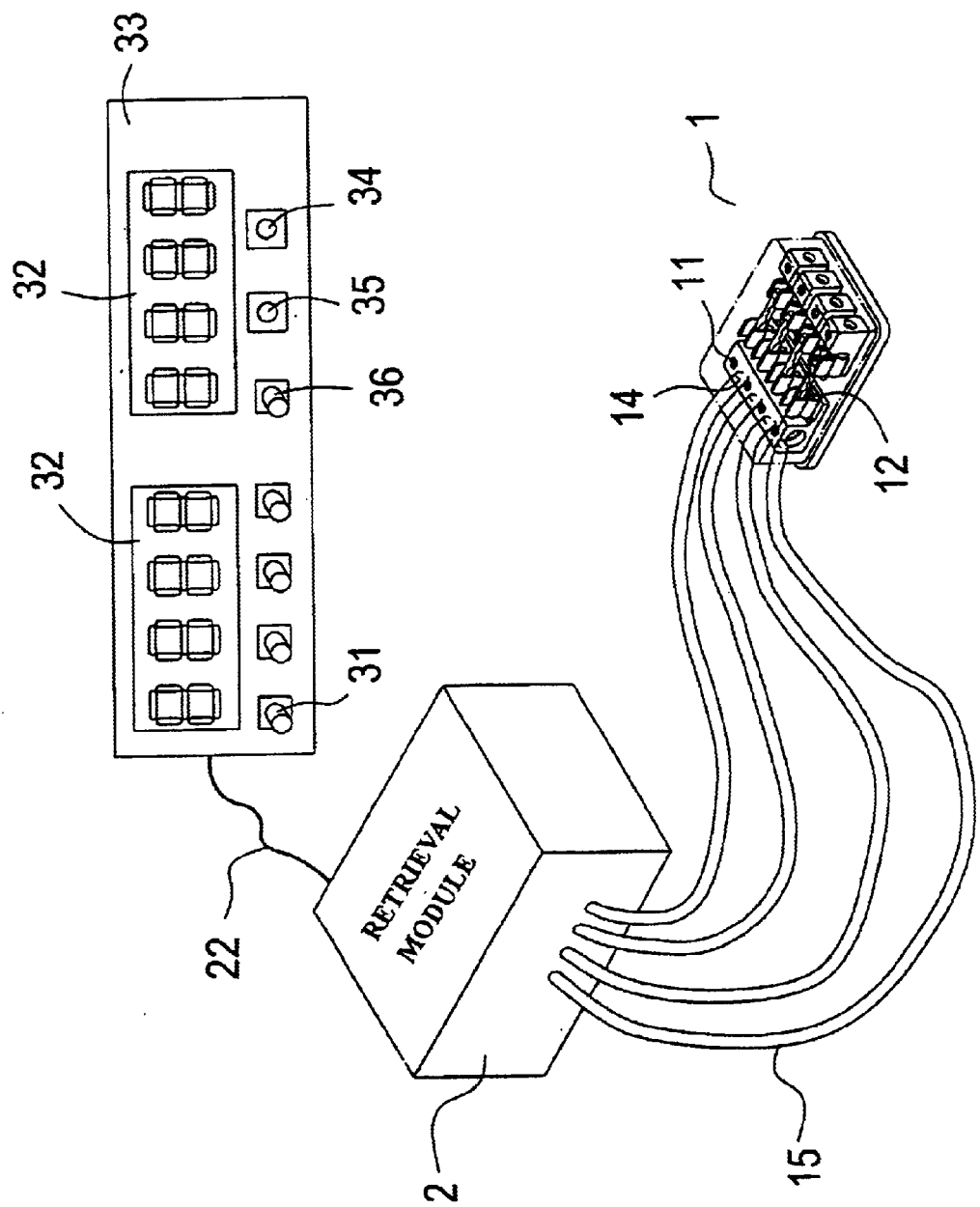
FIG. 3 is a schematic view of a fuse-carrier of the present invention connected to the instrument panel.
Figure 4:
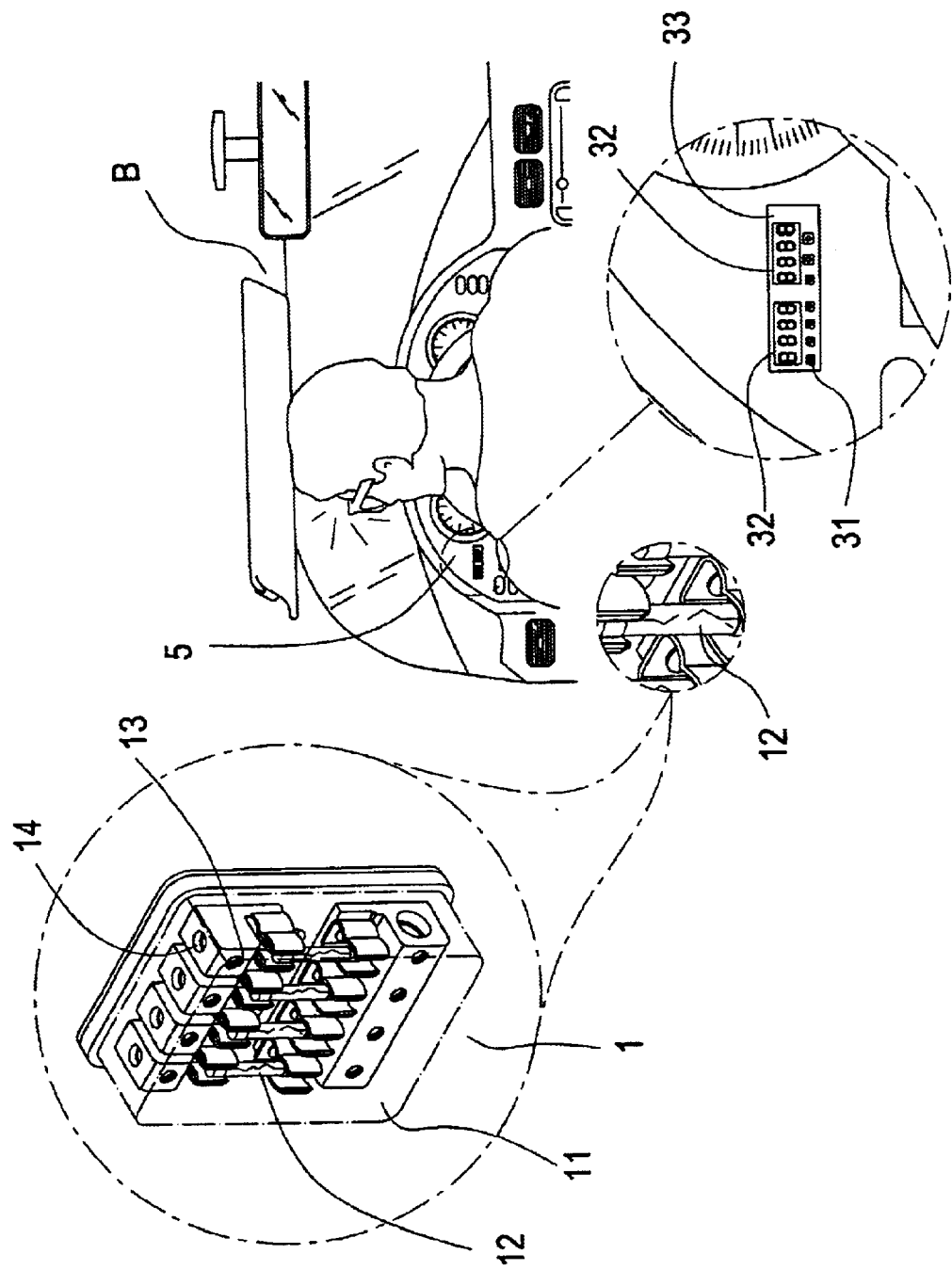
FIG. 4 is a schematic view of the present invention adapted to the instrument panel.

The display module 3 as illustrated in FIG. 3 is essentially comprised of multiple LEDs 31 and a 7-segment display 32 adapted to an instrument panel 33, and each LED 31 is connected to the detection loop of each fuse 12 on the fuse carrier 11 through the signal retrieval module 2 by means of a transmission wire; so that once any fuse 12 is burnt out, its location is clearly displayed as indicated by that of its corresponding LED 31 on the instrument panel 33. Meanwhile, the 7-segment display 32 being connected to the output of the signal retrieval module 2 to retrieve signals of amperage, voltage and power of the electric appliance A connected to each fuse 12, then display the status in numeric values. Furthermore, an alternation switch 34 is provided to switch among the display status. The instrument panel 33 is further provided with a peak hold indicator 35 to automatically keep the memory whenever the amperage becomes greater than the preset maximal amperage. Next to the peak hold indicator 35, a source status LED 36 is provided to display whether the source of the instrument panel is in ON status. Now referring to FIG. 4, the present invention is provided inside an automobile B. Wherein, a fuse-carrier 11 is provided in the automobile B, and multiple units of fuse 12 are inserted into the fuse-carrier 11 with each fuse 12 respectively coded as F1~F4 (also as illustrated in FIGS. 2 and 3). In case that fuse F2 has burnt out, the LED 31 corresponding to fuse F2 displays the location of the burnt out fuse F2 without bothering to check each fuse 12 to save service time otherwise required. Also as illustrated in FIG. 1, values of amperage, voltage and power of each fuse 12 on the fuse-carrier 11 can be retrieved by the signal retrieval module 2 through the DC source detect loop 21 for the 7-segment display 32 of the display module 3 to display to facilitate inspection by a driver of the automobile B.

Comparison and analysis between the present invention and its prior art are summarized as follows:

Defects Found With the Prior Art
1. Failure to judge the location of a failing fuse;
2. Failure for the instrument penal to display numeric values of DC voltage and amperage;
3. Absence of any display to display the location of a failing fuse;
4. Service problems resulted from time and efforts spent in searching for a failing fuse among all the fuses; and
5. Without competition strength in the trade.

Advantages of the Present Invention:
1. Immediate display of the location of the failing fuse;
2. Immediate display of numeric values of DC voltage, DC amperage and power by the display device mounted on the instrument panel;
3. Digital display for easy reading;
4. Selected display of amperage or voltage by means of the alternation switch;
5. Selected display of the maximal value of the power;
6. Practical; and
7. Providing industrial value for mass production.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

I claim:

1. An automobile multi-purpose DC source protection monitor mounted in the body of the automobile comprising:

a fuse module, including multiple units of fuse arranged on each fuse carrier; each fuse being respectively connected to electric appliance; and an individual sensor being provided to each fuse to form an individual detection loop;

a signal retrieval module, including transmission wire connected to the sensor to convert analog signals detected by each fuse into digital signals, then into numeric values; and a display module, to display location of failing electric appliance the fuse connected to, and numeric status of amperage, voltage and power through the signal retrieval module and the digital signal from the detection loop of each fuse from the fuse carrier; and the display module being connected to the signal retrieval module through a control wire;

wherein alternation is made to switch among the numeric values of amperage, voltage and power by means of an alternation switch.

2. The automobile multi-purpose DC source protection monitor as claimed in claim 1, wherein the display module is further provided with a peak hold indicator to automatically keep the memory whenever the amperage exceeds the preset value.

* * * * *